US010224149B2

(12) United States Patent
Miller et al.

(10) Patent No.: US 10,224,149 B2
(45) Date of Patent: *Mar. 5, 2019

(54) BULK MLCC CAPACITOR MODULE

(71) Applicant: KEMET Electronics Corporation, Simpsonville, SC (US)

(72) Inventors: Galen W. Miller, Simpsonville, SC (US); John E. McConnell, Simpsonville, SC (US); John Bultitude, Simpsonville, SC (US); Garry L. Renner, Simpsonville, SC (US)

(73) Assignee: KEMET Electronics Corporation, Simpsonville, SC (US)

( * ) Notice: Subject to any disclaimer, the term of this patent is extended or adjusted under 35 U.S.C. 154(b) by 18 days.

This patent is subject to a terminal disclaimer.

(21) Appl. No.: 15/264,305

(22) Filed: Sep. 13, 2016

(65) Prior Publication Data

US 2017/0169956 A1   Jun. 15, 2017

Related U.S. Application Data

(63) Continuation-in-part of application No. 14/963,766, filed on Dec. 9, 2015, now Pat. No. 9,805,872.

(51) Int. Cl.

| | | |
|---|---|---|
| H01G 4/38 | (2006.01) | |
| H01G 2/06 | (2006.01) | |
| H01G 4/12 | (2006.01) | |
| H01G 4/224 | (2006.01) | |
| H01G 4/232 | (2006.01) | |
| H01G 4/30 | (2006.01) | |
| H01G 4/40 | (2006.01) | |
| H01L 23/48 | (2006.01) | |
| H01L 23/52 | (2006.01) | |
| H05K 1/18 | (2006.01) | |

(52) U.S. Cl.
CPC ............. *H01G 4/38* (2013.01); *H01G 2/06* (2013.01); *H01G 4/12* (2013.01); *H01G 4/224* (2013.01); *H01G 4/232* (2013.01); *H01G 4/2325* (2013.01); *H01G 4/30* (2013.01); *H01G 4/40* (2013.01); *H01L 23/48* (2013.01); *H01L 23/52* (2013.01); *H05K 1/182* (2013.01)

(58) Field of Classification Search
None
See application file for complete search history.

(56) References Cited

U.S. PATENT DOCUMENTS

| | | |
|---|---|---|
| 5,721,163 A | 2/1998 | Sundaresan |
| 6,940,708 B2 | 9/2005 | Yoshii et al. |

(Continued)

*Primary Examiner* — Dion Ferguson
(74) *Attorney, Agent, or Firm* — Joseph T. Guy; Patent Filing Specialist, Inc.

(57) ABSTRACT

Provided is a module comprising a carrier material, comprising a first conductive portion and a second conductive portion, and a multiplicity of electronic components wherein each electronic component comprises a first external termination with at least one first longitudinal edge and a second external termination with at least one second longitudinal edge. A first longitudinal edge of a first electronic component is connected to the first conductive portion by a first interconnect; and a second longitudinal edge of the first electronic component is connected to the second conductive portion by a second interconnect.

55 Claims, 14 Drawing Sheets

(56) References Cited

U.S. PATENT DOCUMENTS

Figure 1:
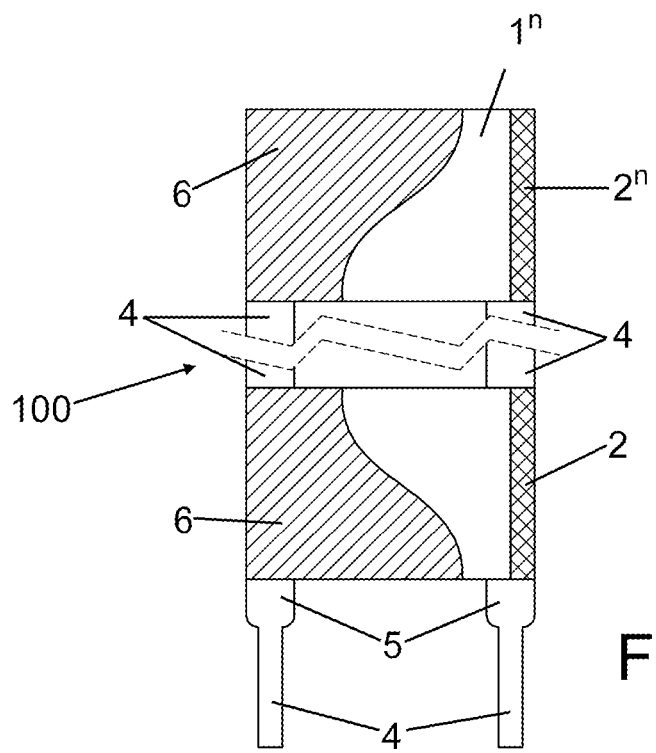

| | | |
|---|---|---|
| 6,958,899 B2 | 10/2005 | Togashi et al. |
| 8,264,816 B2 | 9/2012 | Bultitude |
| 8,575,494 B2 | 11/2013 | Tien |
| 8,873,219 B2 | 10/2014 | Perea et al. |
| 8,902,565 B2 | 12/2014 | McConnell et al. |
| 8,904,609 B2 | 12/2014 | Tsuzuru |
| 8,988,857 B2 | 3/2015 | McConnell et al. |
| 9,025,311 B1 | 5/2015 | Bultitude et al. |
| 9,171,672 B2 | 10/2015 | McConnell et al. |
| 2009/0034155 A1* | 2/2009 | Devoe .................... H01G 4/232 361/306.3 |
| 2010/0243307 A1 | 9/2010 | McConnell |
| 2014/0002952 A1 | 1/2014 | McConnell et al. |
| 2014/0230941 A1 | 8/2014 | Mikami |
| 2014/0238732 A1 | 8/2014 | Itabashi |
| 2014/0240081 A1 | 8/2014 | Murowaki |
| 2014/0240885 A1 | 8/2014 | Kamiya |
| 2014/0240942 A1 | 8/2014 | Itabashi |
| 2015/0187502 A1* | 7/2015 | Hwang .................... H01G 4/38 361/679.01 |

\* cited by examiner

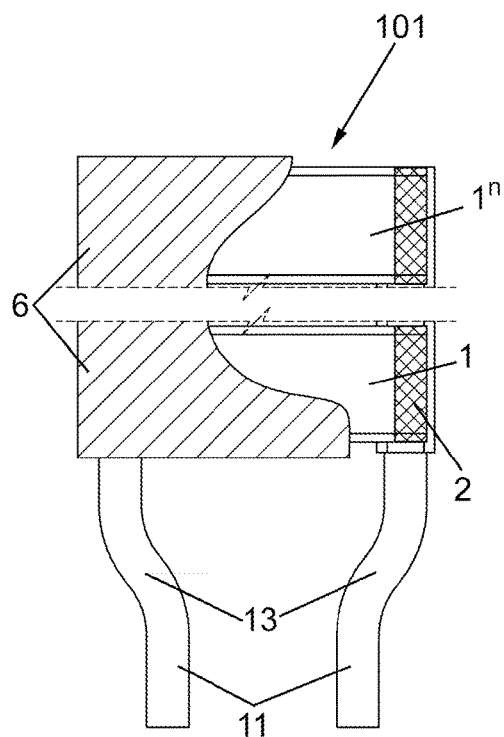
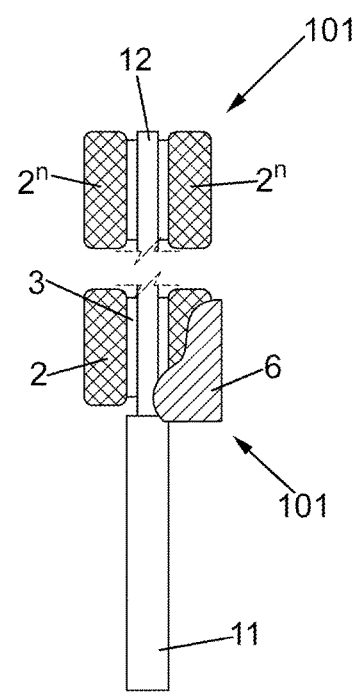
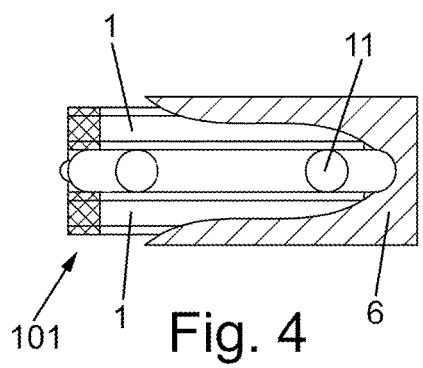
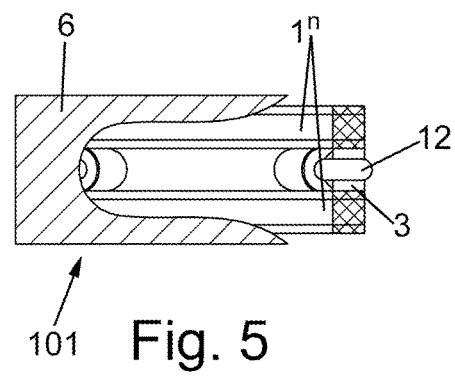

ns, particularly including multilayered ceramic capacitor (MLCC) components, to a component carrier material, such as a lead or substrate, in an array within a single encapsulated package for attachment to an electrical circuit.

BULK MLCC CAPACITOR MODULE

CROSS-REFERENCE TO RELATED APPLICATIONS

This application is a continuation-in-part of pending U.S. patent application Ser. No. 14/963,766 filed Dec. 9, 2015 which is incorporated herein by reference.

BACKGROUND

This invention is related to the art of electrical component packaging. More specifically, the present invention relates to an electrical component package, or module, comprising multiple electrical components therein to provide a specific function that can be incorporated into an electrical circuit assembly. More particularly, the present invention is related to the use of high temperature electrically conductive interconnect materials to attach multiple components, particularly including multilayered ceramic capacitor (MLCC) components, to a component carrier material, such as a lead or substrate, in an array within a single encapsulated package for attachment to an electrical circuit.

Electrical component packages exist with an over molded single active device, such as integrated circuits, in the form of leadless chip carrier (LCCC), plastic leaded chip carrier (PLCC), transistor outline such as TO-220, ball grid arrays (BGA), quad flat package (QFP), single in-line package (SIP), dual in-line packaging (DIP), etc. More specifically, capacitor packages exist for multilayered ceramic capacitor (MLCC) components in the form of axial leaded packages with a single MLCC component, and radial leaded packages with a single MLCC component. Axial and radial MLCC component packages have a limited capacitance based on the maximum geometry of a single MLCC with the capability of meeting the form factor requirements of existing package designs. Other capacitor packages comprising multiple capacitors exist in the form of MLCC component stacks. These MLCC stack packages contain multiple MLCC's of the same size and value capacitors with leads attached to the end of the external terminations of the MLCC. The total capacitance of stacked capacitor packages can only be a multiple of the particular component used for the stack.

If the capacitance requirement for a circuit design exceeds the value of a single MLCC, multiple capacitors must be placed on the circuit board or a different type of capacitor must be selected. The placement of redundant capacitors requires more circuit board space and additional assembly time both of which are contrary to the ongoing desires for further miniaturization and increased efficiency. Selection of an alternate type of capacitor may not meet the superior electrical performance provided in MLCC's and the superior electrical performance is typically desirable in modern electrical circuits. This has led to the introduction of stacked MLCC component packages that have a higher capacitance, require less board space than individually placed components, and have the equivalent assembly time for the placement of a single component. However, because the MLCC components are stacked, they must be of the same case size to allow the terminations of each individual MLCC to interface with the end of the external termination of adjacent MLCCs. In the case of a leaded MLCC stack, the individual MLCC sizes must be the same to interface the leads that connect to the end surface of the MLCC termination.

MLCC components are subject to a failure mode represented by cracks formed due to the board flexing when exposed to a high vibration and/or a high temperature environment. MLCC packages with leads are often required in electrical circuit designs wherein the lead isolates the board flexure from the MLCC thereby mitigating the stress that reaches the MLCC component. However, there are limitations to the assembly of leaded stacks because of the aforementioned lead attachment interface and size and shape variations in the MLCC component that are inherent in the manufacturing processes.

Therefore, a leaded multiple MLCC component package that isolates board stress, provides a higher capacitance for a given footprint, and can be manufactured with less limitations than current designs, is still desired for use in circuit layouts that have confined space requirements and/or a harsh environment. In spite of the ongoing effort those of skill in the art still seek an electrical package with multiple separate components contained therein without the necessity of a common size for the packaged components. Such an advance in the art is provided herein.

SUMMARY OF THE INVENTION

It is the object of the invention to provide an alternate method for an electronic package containing multiple components, particularly including MLCC's, that allows for variation in the form factor of the package and the content of components within the package.

It is another object of the invention to provide a method or combining multiple multi-layered ceramic capacitors (MLCC) into a stacked array to provide a single large or bulk capacitance value component that can be handled using current standard SMT assembly practices and equipment.

A particular feature of the invention is the ability to provide an electronic package wherein components of different shapes and sizes can be commonly packaged while maintaining a footprint representative of a single component.

These and other advantages, as will be realized, are provided in a module comprising a multiplicity of electronic components wherein each electronic component comprises a first external termination with at least one first longitudinal edge and a second external termination with at least one second longitudinal edge. A first lead is connected to the first longitudinal edge by a first interconnect and a second lead is connected to the second longitudinal edge by a second interconnect.

Yet another embodiment is provided in a method for forming a module. The method comprises:
providing a multiplicity of electronic components wherein each electronic component comprises a first external termination with at least one first longitudinal edge and a second external termination with at least on second longitudinal edge;
placing a first lead into contact with the first longitudinal edge with a first interconnect between the first lead and the first longitudinal edge;
placing a second lead into contact with the second longitudinal edge with a second interconnect between the second lead and the second longitudinal edge; and
heating to form a bond of the first interconnect and the second interconnect.

Yet another embodiment is provided in a module comprising a carrier material, comprising a first conductive portion and a second conductive portion, and a multiplicity of electronic components wherein each electronic component comprises a first external termination with at least one first longitudinal edge and a second external termination with at least one second longitudinal edge. A first longitudinal edge of a first electronic component is connected to the first conductive portion by a first interconnect; and a second longitudinal edge of the first electronic component is connected to the second conductive portion by a second interconnect.

Yet another embodiment is provided in a method for forming a module comprising:
providing a multiplicity of electronic components wherein each electronic component comprises a first external termination with at least one first longitudinal edge and a second external termination with at least one second longitudinal edge;
placing a first conductor into contact with the first longitudinal edge with a first interconnect between the first conductor and the first longitudinal edge;
placing a second conductor into contact with the second longitudinal edge with a second interconnect between the second conductor and the second longitudinal edge; and
heating to form a bond of the first interconnect and the second interconnect.

FIGURES

Figure 2:
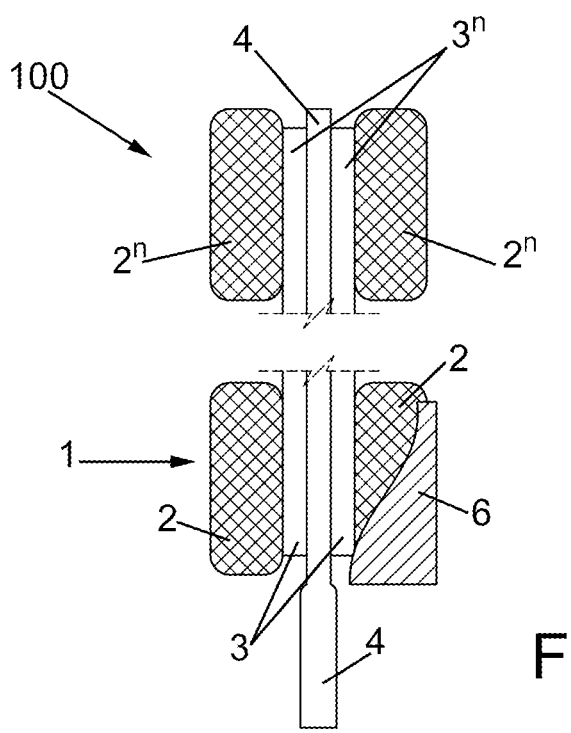
Figure 7:
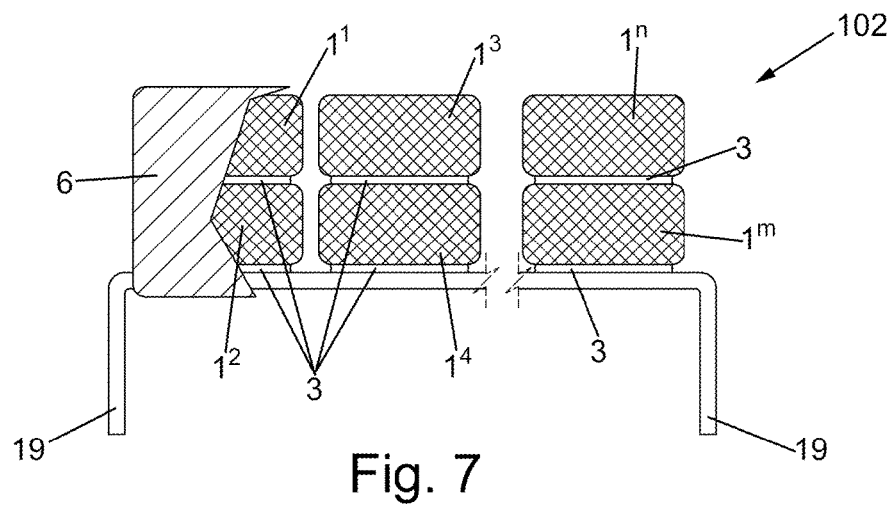
Figure 8:
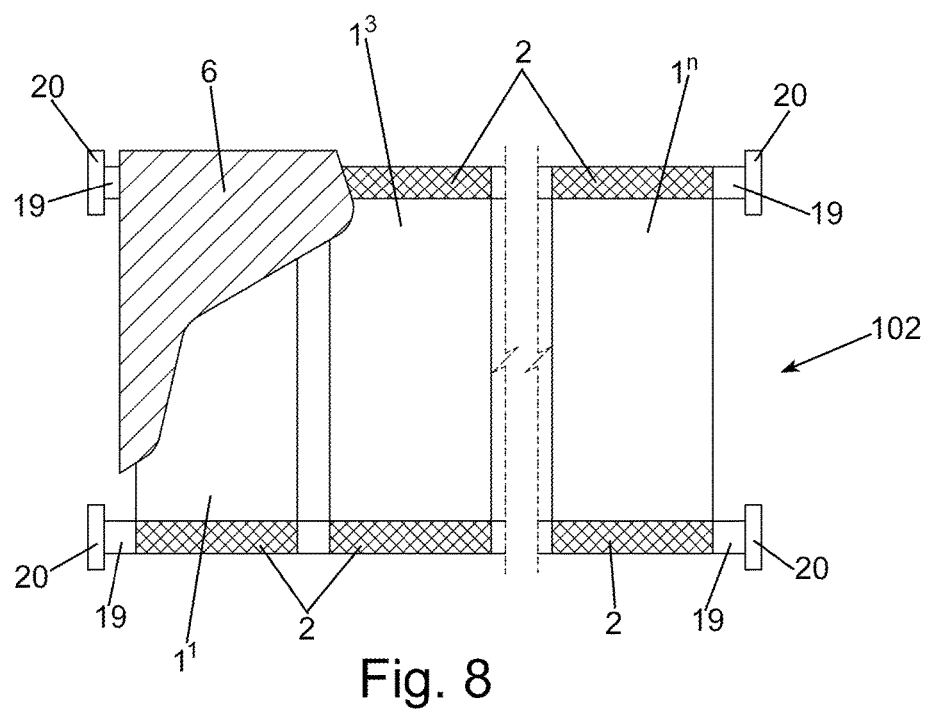
Figure 9:
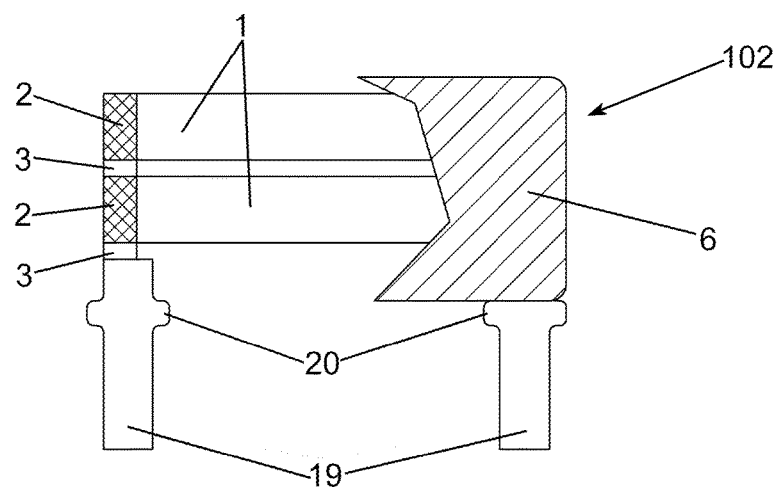
Figures 10, 10A:
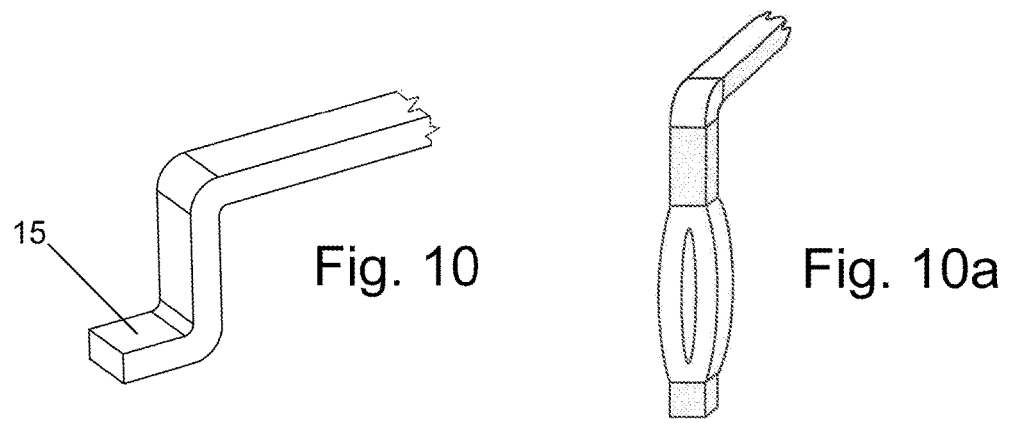
Figure 11:
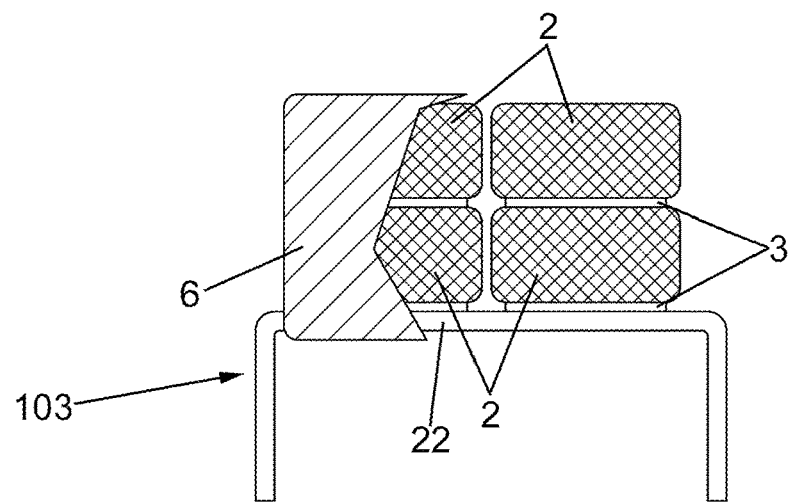
Figure 12:
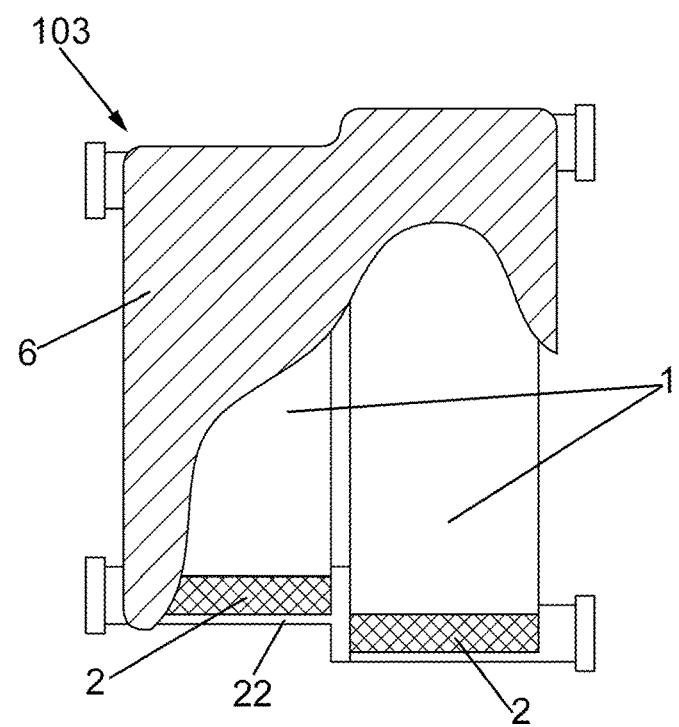
Figure 13:
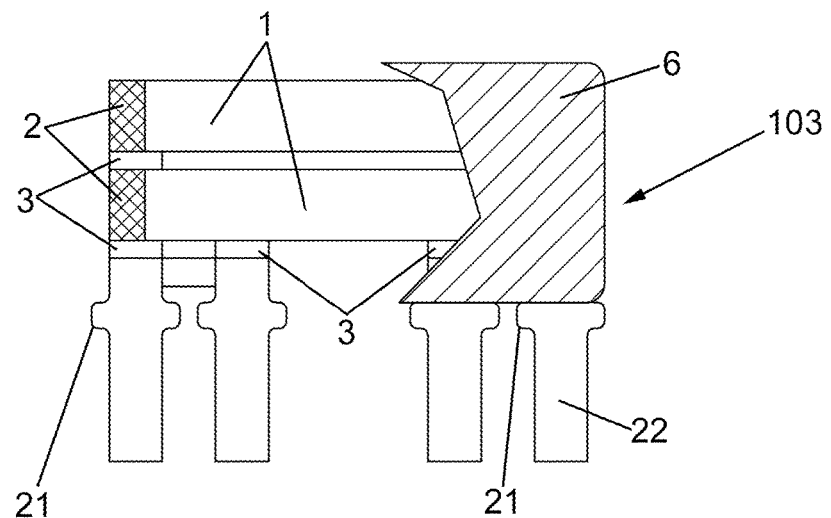
Figure 14:
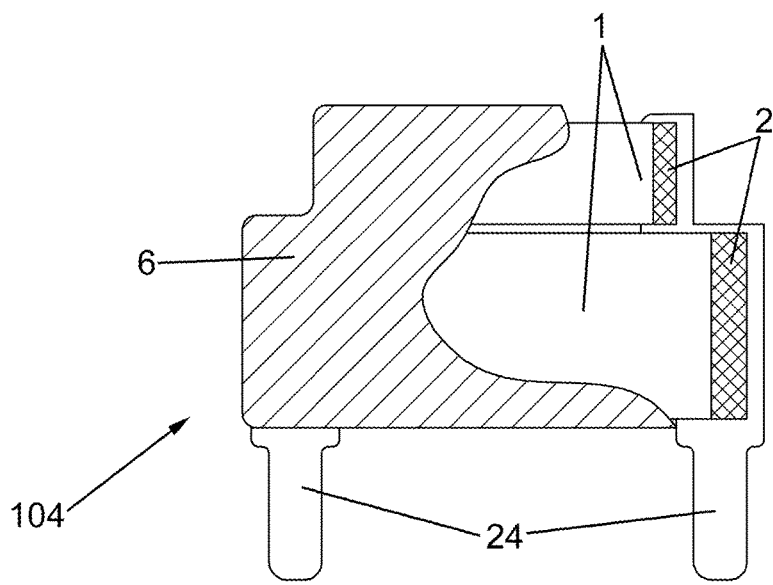
Figure 15:
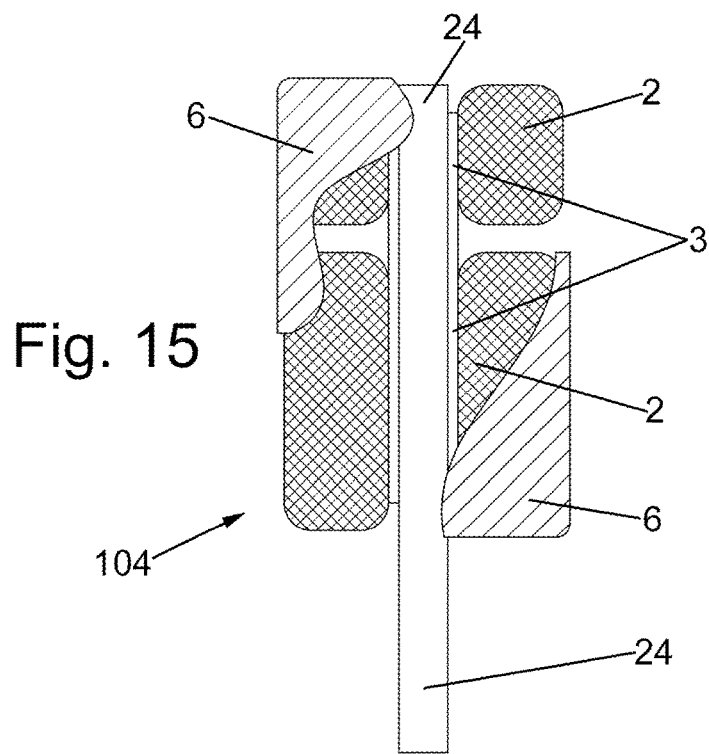
Figure 16:
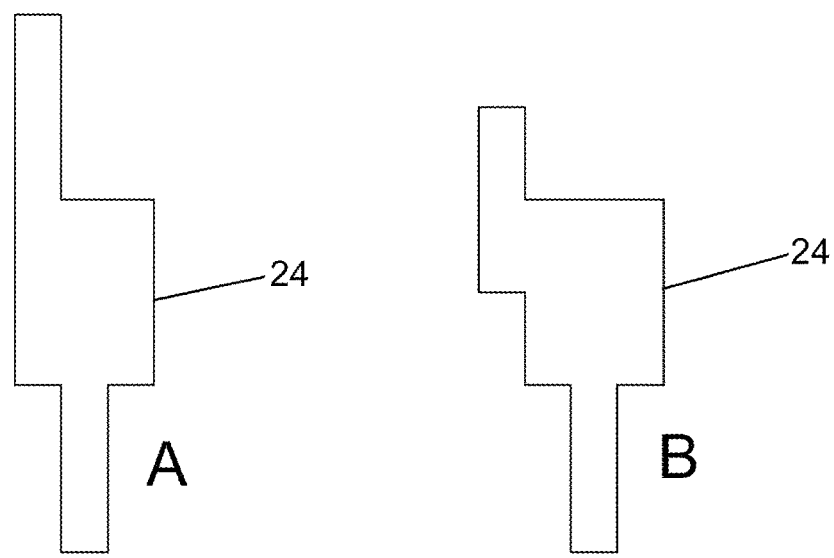
Figure 17:
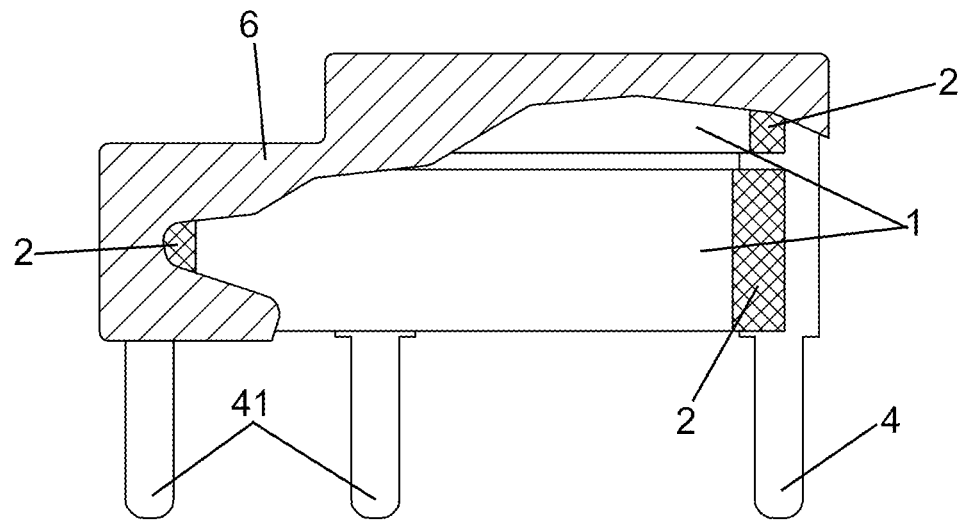
Figure 18:
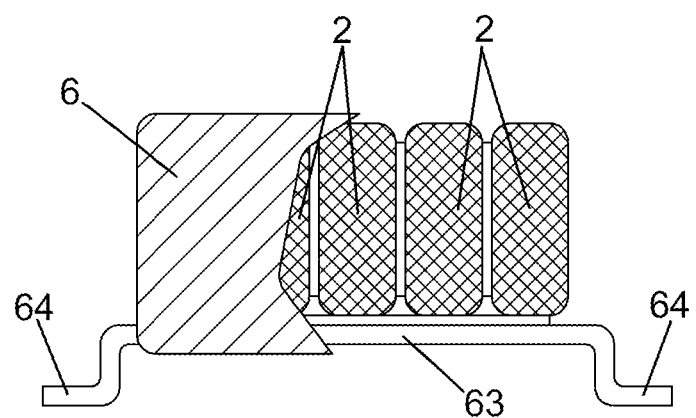
Figure 19:
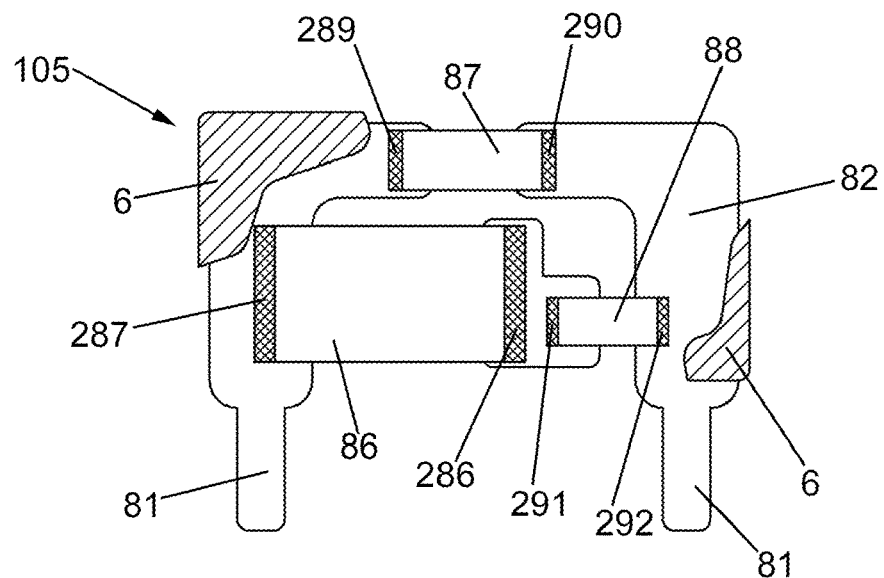
Figure 20:
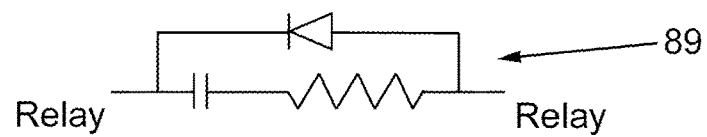
Figure 21:
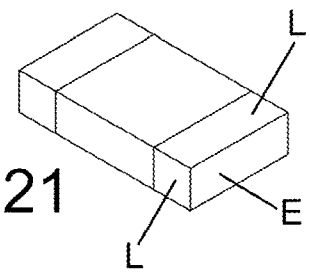
Figure 22:
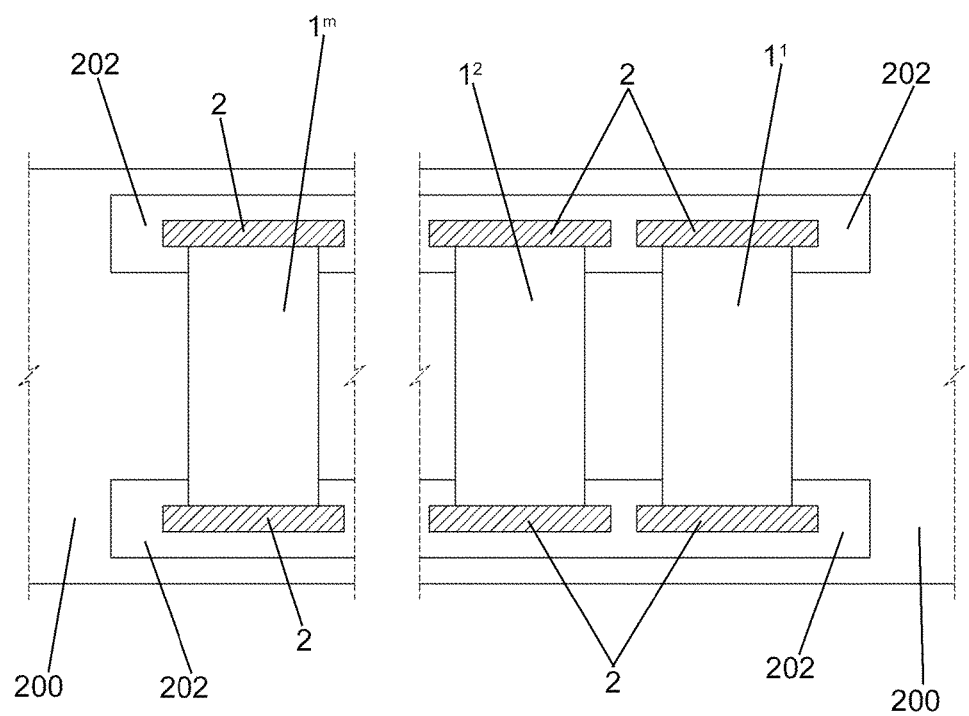
Figure 23:
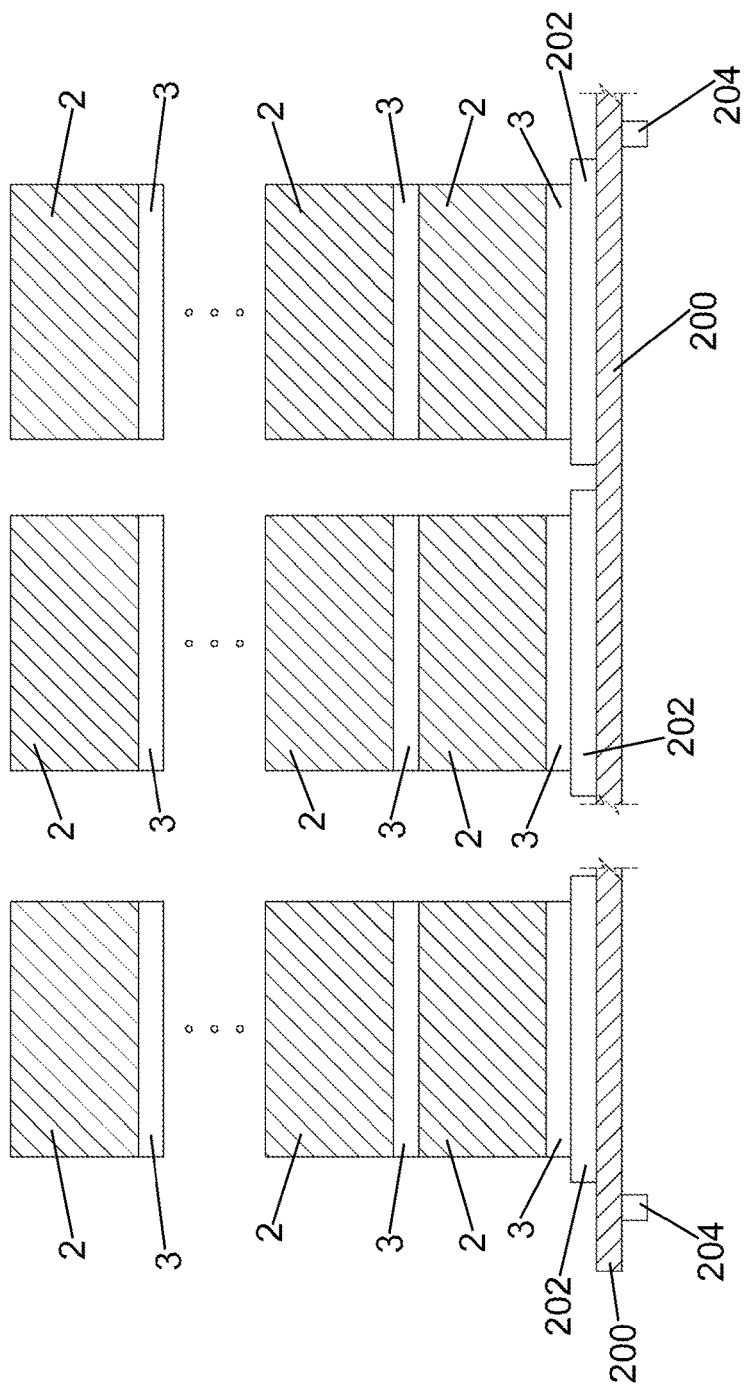
Figure 24:
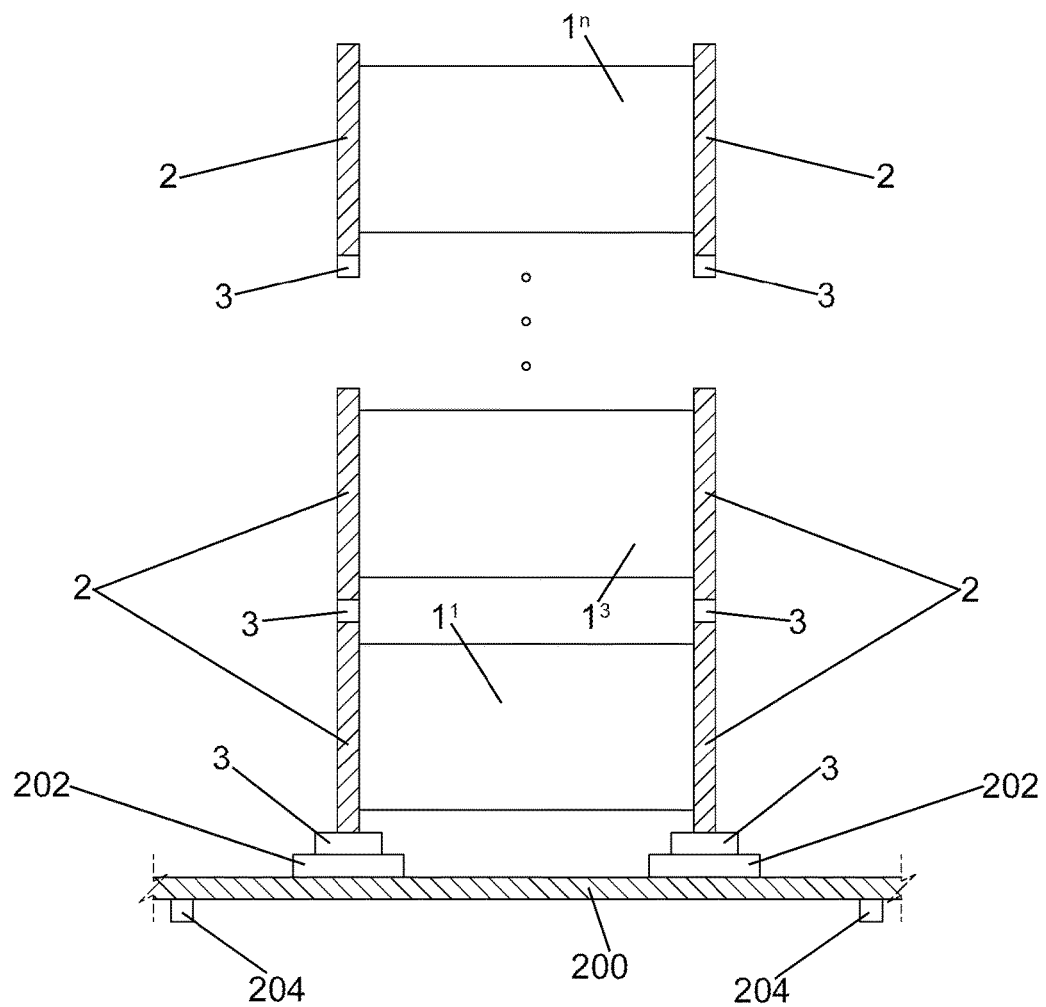
Figure 25:
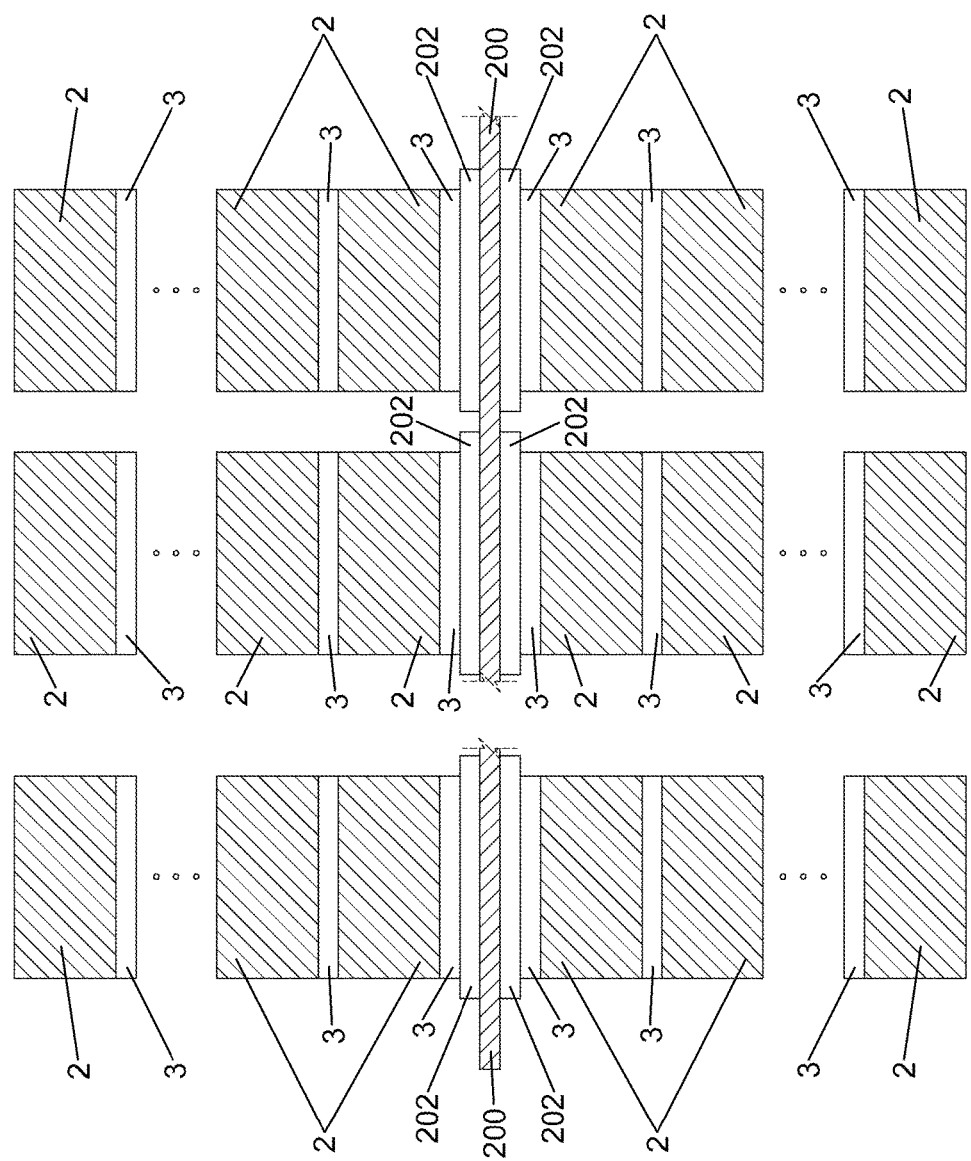
Figure 26:
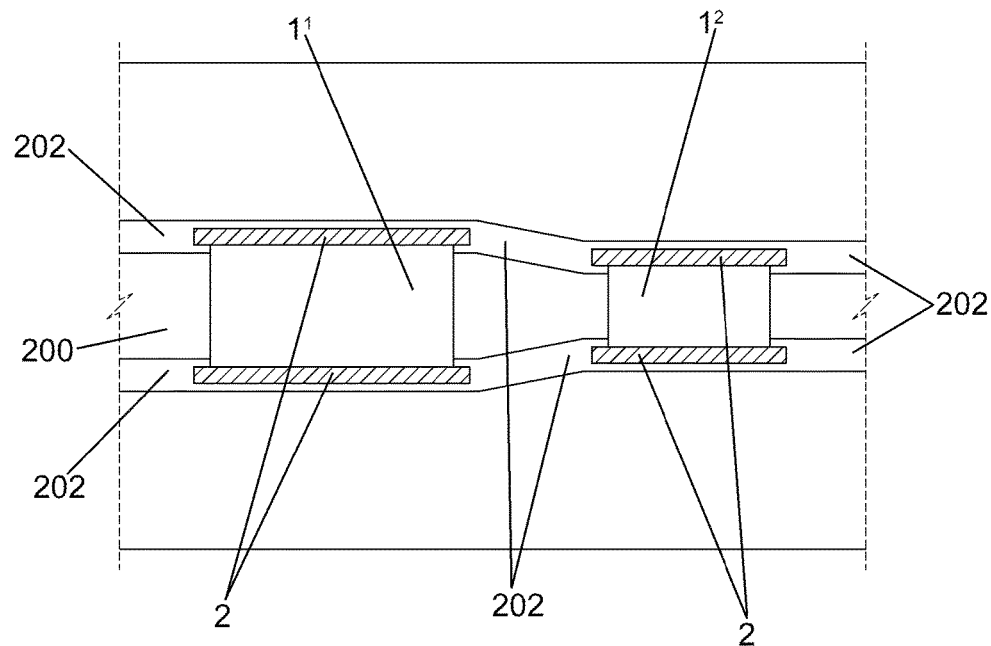
Figure 27:
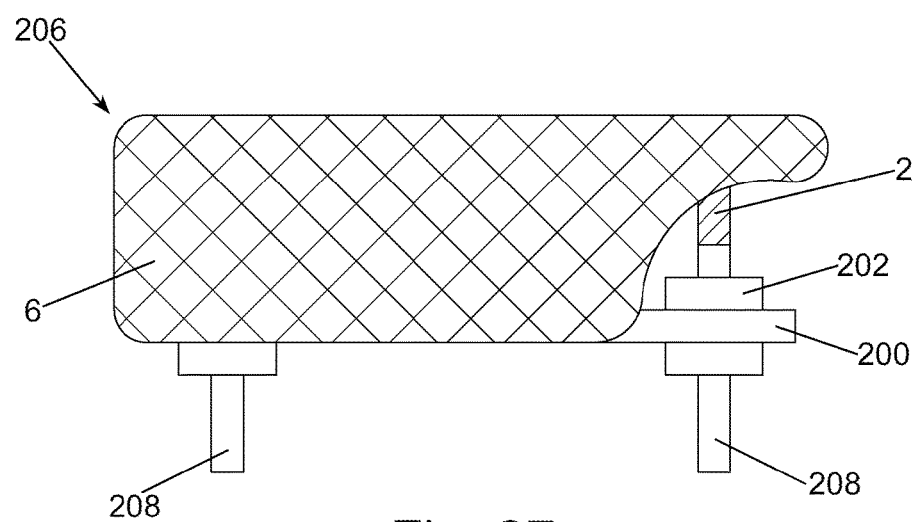

FIG. 1 is a schematic partial-cutaway side view of an embodiment of the invention.
FIG. 2 is a schematic partial-cutaway end view of an embodiment of the invention.
FIG. 3 is a schematic partial-cutaway side view of an embodiment of the invention.
FIG. 4 is a schematic partial-cutaway bottom view of an embodiment of the invention.
FIG. 5 is a schematic partial-cutaway top view of an embodiment of the invention.
FIG. 6 is a schematic partial-cutaway end view of an embodiment of the invention.
FIG. 7 is a schematic partial-cutaway end view of an embodiment of the invention.
FIG. 8 is a schematic partial-cutaway top view of an embodiment of the invention.
FIG. 9 is a schematic partial-cutaway side view of an embodiment of the invention.
FIGS. 10 and 10A are schematic partial-cutaway views of leads of the invention.
FIG. 11 is a schematic partial-cutaway end view of an embodiment of the invention.
FIG. 12 is a schematic partial-cutaway top view of an embodiment of the invention.
FIG. 13 is a schematic partial-cutaway side view of an embodiment of the invention.
FIG. 14 is a schematic partial-cutaway side view of an embodiment of the invention.
FIG. 15 is a schematic partial-cutaway end view of an embodiment of the invention.
FIG. 16 is a schematic view of leads of the invention.
FIG. 17 is a schematic partial-cutaway side view of an embodiment of the invention.
FIG. 18 is a schematic partial-cutaway end view of an embodiment of the invention.
FIG. 19 is a schematic partial-cutaway side view of an embodiment of the invention.
FIG. 20 is an electrical schematic diagram of an embodiment of the invention.
FIG. 21 is a schematic representation of an electronic component wherein the longitudinal and end sections of the external termination are distinguished.
FIG. 22 is a schematic top view of an embodiment of the invention.
FIG. 23 is a schematic end view of an embodiment of the invention.
FIG. 24 is a schematic side view of an embodiment of the invention.
FIG. 25 is a schematic end view of an embodiment of the invention.
FIG. 26 is a schematic top view of an embodiment of the invention.
FIG. 27 is a schematic end partial cut-away end view of an embodiment of the invention.

DESCRIPTION

The instant invention is specific to an electrical component package comprising multiple components, preferably passive components including multilayered ceramic capacitor (MLCC) components, with common terminations. More specifically, the present invention is related to an electrical component package, or module, wherein the components can be of different sizes, shapes and functions yet commonly terminated.

The external terminations of at least some of the electronic components are commonly connected to a carrier material, such as leads or the conductive traces of a substrate, with a high temperature conductive interface material, or adhesive, and with or without an encapsulation/over molding or pre-molded lead frame of housing for use in an electrical circuit assembly. The carrier material may be formed for assembly to a printed circuit board (PCB) as a surface mounted device (SMD) or as a through-hole device. The component content and carrier material can be varied to provide custom package designs to meet specific electrical circuit design requirements.

Combining multiple components, such as multiple MLCC's, within a common electrical package increases the functionality, such as capacitance value, beyond that available with the use of a single component while utilizing a smaller footprint in an electrical circuit than the use of equivalent single individual components. When using MLCC's, for example, the total capacitance value of the package is determined by the number of MLCC's within the electronic package and the capacitance value of each individual MLCC. The instant invention allows for variation in not only the quantity and mix of electronic components within a package but also the geometric size of the component within the same package. This allows the electrical package to be designed with an increased capability to vary functionality within a package and offers a unique opportunity to provide, as an example, a more distinctive total capacitance value when employing MLCC's. This also allows for the use of other, preferably passive, components thereby increasing the functionality available in a given space.

The method of attachment of the components to form the electrical package is critical to the integrity of the package during subsequent part handling and assembly. With the use of high temperature interconnect materials in the form of a transient liquid phase sintering (TLPS) interconnect material, the electrical package, also referred to as an electrical assembly, is able to withstand subsequent high temperature processing in the form of over molding and soldering and the electrical package is able to withstand harsh electrical circuit environments. Other interconnect materials such as high temperature solders and conductive epoxies may be used as well to attach the components but may have a more limited application. Attaching individual components, particularly MLCC's, to a carrier material in the same orientation as a typical surface mounted device (SMD) with contact on the side or longitudinal face of the components external terminations, rather than that of the prior art along the end face of the external terminations of the MLCC, removes the requirement for all components to be of equal size. This form of attachment allows for multiple MLCC's, or other components, to be assembled in the form of a radial package in a smaller package outline than that of individual components. This differs from the prior art for radial packages where leads are soldered to the termination end faces of a single MLCC component. This method of attachment also allows the components to be assembled on opposing sides of a lead frame or substrate. In the present invention it is preferred that the lead or substrate is attached to a longitudinal face with no lead or substrate attached to an end face.

Prior art multiple MLCC modules are primarily in the form of stacks where the leads are attached to the capacitor terminal ends as described in U.S. Pat. Nos. 6,721,163; 8,988,857; 8,873,219; 6,958,899; 6,940,708 and U.S. Pat. Appl. Publ. No. 20100243307. This requires that the capacitors be sorted for size to ensure a robust interface with the lead. The instant invention eliminates the need for sorting capacitors, or other integrated components, by size because the lead is attached to the longitudinal face of the components external termination. The second component in the stack is terminated through the first component external terminations further eliminating component size sorting. Unlike the prior art, the instant invention also allows the components to be assembled on opposing sides of the lead or substrate thereby providing a more efficient method for packaging multiple components such as MLCCs. The instant invention also allows unsorted component sizes to be stacked and assembled to leads or a substrate with the components in a vertical orientation.

Another advantage of the instant invention is the ability to assemble components with different case sizes within the same electronic package allowing for more flexibility in module functionality. A further advantage of the instant invention is the ability to incorporate a combination of discreet electronic components such as MLCC's, resistors, varistors, inductors, diodes, fuses, integrated circuits (IC), etc. into a common electrical package to create a custom electronic module. It is preferable that at least one of the electronic components is an MLCC and more preferably all of the components are MLCCs. Prior art in the form of a smart capacitor incorporates an alumina substrate with printed thick film materials to form a fuse and resistor as detailed in U.S. Pat. Nos. 8,904,609 and 8,264,816 rather than the use of discreet components. Other prior art has used a lead frame to provide a fuse with an MLCC such as in U.S. Publ. Pat. Appl. Nos. 20140238732, 20140240941, 20140240081, 20140240942 and 20140240885. Using discreet components allows increased flexibility in the assembly of the package without adding complexity to the module design. Discreet component values can be changed quickly, easily, and without a large cost impact to meet the requirements of a circuit design.

The instant invention also allows for a method of assembly that utilizes current process technologies and common commercially available assembly equipment. This provides for a more reasonable investment cost and implementation timing.

The electronic package comprises multiple components, and preferably at least one capacitor, attached to a carrier material, such as a lead or substrate, that provides a method of attachment in an electrical circuit with either through-hole, compliant pin, surface mount technologies, or other interconnect method.

An MLCC comprises first planar internal electrode layers in contact with a first external termination. Second planar internal electrode layers are interleaved with the first planar internal electrodes wherein the second planar internal electrodes contact a second external termination. A dielectric layer isolates the first planer internal planer electrodes from the second planer internal electrodes. The number of first and second planer internal electrodes, and the geometric size of the components, determines the capacitance value of the device. The manufacturing and structure of MLCC's is well known to those of skill in the art and it is therefore not necessary for further discussion herein.

The invention will be described with reference to the various figures forming an integral non-limiting component of the disclosure. Throughout the disclosure similar elements will be numbered accordingly.

An embodiment of the invention will be described with reference to FIGS. 1 and 2 wherein an electronic package, generally represented at 100, is schematically illustrated in partial cut-away side view in FIG. 1 and partial schematic cut-away end view in FIG. 2. The electronic components, 1; individually representing an MLCC, a resistor, a varistor, an inductor, a diode, a fuse or an integrated circuit; comprise external terminations, 2, with at least one longitudinal edge and preferably a longitudinal edge on each side of the component. An interconnect material 3 preferably selected from transient liquid phase sintering (TLPS) conductive interconnect material, is along a longitudinal edge of the external termination, 2, of each electronic component thereby electrically connecting a flat lead frame, 4, as the carrier material, to the aligned external termination of each electronic component. The flat lead frame is preferably of plated ferrous or non-ferrous material. The lead frames preferably comprise a through-hole assembly stand-off feature, 5. The entire electronic package is preferably encapsulated, 6, except for the standoff feature, 5, and the terminal end of the lead frame, 4. The lead frame may have a constant thickness or may be stamped, or coined, to be thinner in the component attachment region. In addition to the variation of the capacitance of the individual MLCC components, when multiple MLCCs are used, the number of components assembled in the package can be varied with additional electronic components, 1″, added to the electronic package to further define the total functionality of the package. In FIGS. 1 and 2, and elsewhere herein, the additional electronic components represented by 1″ are indicative of an integer number of additional electronic components with the superscript "n" representing the integer number with "n" being an integer between 2 and 100. For the purposes of the invention, the longitudinal edges are preferably the co-planer side faces illustrated as "L" in FIG. 21 and are distinguished from the preferably parallel but not co-planer edge face illustrated as "E" in FIG. 21.

An embodiment of the invention will be described with reference to FIGS. 3-6 wherein an electronic package is generally schematically represented at 101. The electronic package is represented in partial cut-away side view in FIG. 3, in partial cut-away bottom view in FIG. 4, in partial cut-away top view in FIG. 5 and in partial cut-away side view in FIG. 6. In FIGS. 3-6 each electronic component, 1; individually representing an MLCC, a resistor, a varistor, an inductor, a diode, a fuse or an integrated circuit; comprise external terminations, 2, on each side which are electrically adhered to a round lead, 11, with an interconnect material, 3, preferably selected from TLPS, along the longitudinal edges of the terminations, 2. The longer longitudinal surface can be mounted to a carrier material in the form of a lead, as illustrated in FIG. 6, or the shorter longitudinal surface can be mounted to the lead as illustrated elsewhere herein. The carrier material represented as a round lead, 11, is preferably a plated ferrous or non-ferrous material comprising a coined flat terminal pad, 12, and a through-hole assembly stand-off feature, 13. The entire electronic package, except for the stand-off feature and terminal end of the round lead, is preferably encapsulated, 6. The number and type of components assembled in the package can be varied from 2 to 100 to further define the total capacitance of the package or to provide additional functionality.

An embodiment of the invention will be described with reference to FIGS. 7-9 wherein an electronic package is generally represented schematically at 102. The electronic package is illustrated in schematic partial cut-away end view in FIG. 7, in partial cut-away top view in FIG. 8 and in partial cut-away side view in FIG. 9. Each electronic component, 1, comprises external terminations, 2, on each side with at least one longitudinal edge and preferably a longitudinal edge on each side. For one row of electronic components, represented by $1^2$, $1^4$, and $1^m$, the longitudinal edge of the external terminations are in electric contact with the carrier material represented as leads, 19, by interconnect material, 3, preferably selected from TLPS, along the longitudinal edges of the terminations, 2. For a subsequent row of electronic components, represented by $1^1$, $1^3$ and $1^n$, the longitudinal edge of the external terminations are attached to the adjacent longitudinal edge of the external terminations of the first row of electronic components by an interconnect material. The leads are preferably a flat lead frame of plated ferrous or non-ferrous material comprising a through-hole assembly stand-off feature, 20. The entire electronic package except for the stand-off feature and terminal end of the lead are preferably encapsulated, 6, by coating, potting in a pre-molded housing, or other encapsulation methods known in the art. An advantage of the invention of FIGS. 7-9 is the ability to stack the component vertically and horizontally, in rows and columns, with adjacent longitudinal edges bonded by an interconnect thereby increasing the number of components included in the electronic package. It would be understood that the number of rows and columns can be quite large with up to 100 components being included in the assembly. Instead of the stand-off feature illustrated in FIGS. 7-9 a lead, 19, with a foot, 15, extending parallel to the lead, as illustrated schematically in FIG. 10, can be used thereby providing a surface mount lead for an electronic package. Another option is to provide a compliant pin lead for mechanical attachment as illustrated schematically in FIG. 10a.

An embodiment of the invention will be described with reference to FIGS. 11-13 wherein an electronic package, 103, is schematically illustrated in partial cut-away end view in FIG. 11, partial cut-away top view in FIG. 12 and partial cut-away side view in FIG. 13. In FIGS. 11-13, electronic components, 1, of varying size are illustrated wherein each component comprises external terminations, 2, on opposite sides wherein each external termination has at least one longitudinal edge and preferably multiple longitudinal edges. The carrier material, represented by a laterally offset lead frame, 22, has a lateral step thereby allowing electronic components to be placed thereon wherein electronic components in a horizontal stack are of different lengths. Laterally offset, as defined herein, is defined as offset in a plane parallel to the substrate upon which the electronic package is mounted. The laterally offset lead frame is illustrated with an optional stand-off feature, 21, with the understanding that a foot, as illustrated in FIG. 10, could be employed. On each side of a first row external terminations are in electrical contact with the laterally offset lead frame by an interconnect material, 3, preferably selected from TLPS, along the longitudinal edges of the external terminations, 2. The laterally offset lead frame allows for an array of electronic components of different sizes within the same electronic package. The entire electronic package, except for the stand-off feature and terminal end of the lead, are preferably encapsulated, 6. An embodiment is illustrated in FIG. 18 wherein the short longitudinal side of the electronic components are mounted to the lead frame, 63, and the lead frame has a foot, 64. For each embodiment the electronic component can be mounted with either the longer longitudinal side or the shorter longitudinal side in electrical contact with the carrier material, or combinations thereof. In the embodiments illustrated in FIGS. 11, 12, 13, 18 and elsewhere herein additional rows and columns can be added with adjacent longitudinal edges of the external terminations bonded by an interconnect material which are not specifically illustrated for clarity.

An embodiment of the invention will be described with reference to FIGS. 14 and 15. FIG. 14 is a partial cut-away side schematic view of an electronic package, generally represented at 104, and FIG. 15 is a partial cut-away edge schematic view. In FIGS. 14 and 15 a horizontally offset lead frame, 24, as the carrier material is utilized to accommodate electronic components of different sizes. Isolated horizontally offset lead frames are illustrated in schematic side view in FIG. 16. Horizontally offset, as defined herein, is an offset in a plane perpendicular to the substrate upon which the electronic package is mounted.

An embodiment of the invention is illustrated in schematic cut-away side view in FIG. 17 wherein a carrier material represented as a flat lead frame, 4, is as described relative to FIG. 1, is incorporated with secondary flat lead frames, 41, as the carrier material wherein a secondary flat lead frame is in electrical contact with less than all of the electronic components of an electronic package. Lead frame, 4, for example could be ground with each lead frame 41 having a different functionality. It would be understood that additional capability can be incorporated with additional components being placed in electrical contact with lead 4 and a select lead 41 either directly or through the longitudinal edge of an adjacent component.

An advantage of the invention is the fact that each stack, extending vertically away from the substrate is not limited in height by any other stack.

Another option is to mount the components to the leads through the shorter of the longitudinal terminations as illustrated in FIG. 18. The components, 2, are bonded to the flat surface of the lead frame, 63, as the carrier material. The lead surface for bonding is thus minimized.

An embodiment of the invention will be described with reference to FIG. 19 wherein a plurality of horizontally offset lead frames as carrier materials are utilized to form an electronic package with multiple functions. In FIG. 19, the electronic package, generally represented by 105, comprises a first component, 86, with a horizontally offset lead frame in electrical contact with each external termination, 286 and 287. One horizontally offset lead frame, 81, is also in electrical contact with an external termination 289 of a second component, 87. Another horizontally offset lead frame is in electrical contact with external termination 286 of component 86 and external termination 291 of component 88. Horizontally offset lead frame 82 is in electrical contact with external termination 290 of component 87 and external termination of component 88. As would be realized from FIG. 19, the degree of offset can be varied depending on the components employed and the combinations of components, 290, available is therefore very large in number. By way of non-limiting example, if component 86 is an MLCC, component 87 is a diode and element 88 is a resistor an electronic package can be prepared with an electrical schematic diagram 89 as illustrated in FIG. 20.

An embodiment of the invention will be described with reference to FIGS. 22-24 wherein FIG. 22 is a top view representation, FIG. 23 is an end view representation and FIG. 24 is a side view representation. In FIGS. 22-24, the electronic components, 1, comprise external terminations, 2, with at least one longitudinal edge and preferably a longitudinal edge on each side of the component. An interconnect material, 3, electrically connects the longitudinal edge of each external termination, 2, of each electronic component, 1, in a first row to a circuit trace, 202, of a substrate, 200, as the carrier material. In subsequent rows the longitudinal edge of each external termination of each electronic component is attached to the adjacent external termination closer to the substrate by an interconnect material, 3. The electronic components can therefore be defined as being in rows, aligned parallel to the substrate, and in columns, aligned perpendicular to the substrate, thereby allowing for a large number of electronic components in a small footprint. Solder pads, 204, on the substrate opposite the electronic components, allow the substrate to be surface mounted thereby providing a single surface mount device for standard surface mount assembly having a large number of electronic components functioning as a single component.

An embodiment will be described with reference to FIG. 25 wherein a side view is provided. In FIG. 25, the carrier material, represented as a substrate, 200, with circuit traces, 202, of the carrier material are on opposite faces thereof. A first row of external terminations, 2, of the electronic components are in electrical contact with interconnect material, 3, and each subsequent row is attached to an adjacent electronic component closer to the substrate with interconnect material as described relative to FIGS. 22-24. It would be apparent that the number of rows and columns can be quite large on either side of the substrate.

An embodiment of the invention will be described with reference to FIG. 26. In FIG. 26 a larger first electronic component, $1^1$, and a smaller second electronic component, $1^2$, are illustrated wherein the circuit trace, 202, deviates from linearity to accommodate the differences in distance between the external terminations, 2, on each electronic component. It would be apparent from the previous description that the number of electronic components of a common size, in a stack, could be quite large and the circuit trace with a deviation from linearity could have multiple deviations to accommodate many sizes over the length of the circuit trace.

An embodiment of the invention is illustrated in FIG. 27 wherein an electronic device, 206, comprising a multiplicity of electronic components in rows and columns as described above is attached to a carrier material comprising circuit trace, 202, on a substrate, 200, wherein the external termination, 2, of the lowermost electronic component is adhered to the circuit trace and in electrical contact through interconnect material, 3. Pins, 208, in electrical contact with the circuit traces allow the electronic device to be pin mounted to a second substrate. The entire electronic device, except for the pins, can be encapsulated, 6, or encased in a high temperature plastic over-molded lead frame.

The carrier material may comprise a single substrate material of high temperature fiberglass reinforced polyester (FRP) printed circuit board (PCB), ceramic (alumina), polyimide laminate, insulated metal substrate (IMS), high temperature rated plated on plastic, or of a high temperature plastic over-molded lead frame. The carrier material as described, along with the added capability to provide a conductor between component stacks, provides an advantage over the prior art.

The electronic package comprises multiple electronic components, preferably MLCC's, attached to a carrier material that provides a method of attachment in an electrical circuit with either through-hole or surface mount technologies. The MLCC components comprise first planar internal electrode layers in contact with a first external termination. Second planar internal electrode layers are interleaved with the first planar internal electrodes wherein the second planar internal electrodes contact a second external termination. A dielectric layer isolates the first internal planer electrodes from the second layer internal planar electrodes. The number of first and second layer internal electrodes and the geometric size of the component determine the capacitance value of the device.

Combining multiple MLCC components within a package increases the capacitance value beyond what is capable with the use of a single MLCC device and requires smaller footprint in an electrical circuit than the use of equivalent single MLCC's. The total capacitance value of the package is determined by the number of MLCC's within the electronic package and the capacitance value of each individual MLCC. The capability to vary not only the quantity of MLCC components within a package but also the geometric size of the MLCC within the same package allows the package to be designed with an increased flexibility to vary the package capacitance and offers a unique opportunity to provide a more distinctive total capacitance value.

The method of attachment of the multiple MLCC devices is critical to the integrity of the package during subsequent part handling and assembly. With the use of high temperature interconnect materials in the form of a transient liquid phase sintering interconnect material (TLPS-IM), the product is able to withstand subsequent high temperature processing in the form of over molding and soldering and also withstand high temperature electrical circuit environments. Other interconnect materials such as high temperature solders and conductive epoxies may be used as well to attach the MLCC components but may have a more limited application. Attaching individual MLCC's to a carrier material in the same orientation as a typical surface mounted device (SMD) with contact on the side or longitudinal face of the MLCC external terminations, rather than along the end face of the MLCC external termination, removes the requirement for all components to be of equal size. This method of attachment also allows the components to be assembled on opposing sides of the substrate carrier. An MLCC array carrier may also incorporate additional common circuitry designs to include other electrical components such as resistors, fuses and diodes.

Attaching a lead to the end face of one capacitor termination and attaching a second lead to the end face of a second capacitor termination that is common in present MLCC array assembly technology results in higher material costs and a more difficult and costly assembly method. Therefore, a lower material and assembly cost method of producing a bulk capacitance module with improved design flexibility is desired.

One embodiment of instant invention provides an advantage by eliminating the ferrous or non-ferrous lead-frame attached to the external terminations and replacing it with a single carrier material in the form of a high temperature fiberglass reinforced polyester (FRP) or glass-reinforced epoxy laminate (FR4) printed circuit board (PCB), a ceramic such as alumina, polyimide laminate, insulated metal substrate (IMS), or a high temperature rated plated on plastic that serves as both a carrier of the multiplicity of stacks of electronic components and as an interconnect to the array of stacks. The single carrier material comprises a first printed conductor to interconnect the first stack terminations and a second conductor to attach the second terminations. The first and second printed conductors may also be used to connect first and second terminals to an electrical circuit. Another aspect of the current art is that the carrier material may comprise a ferrous lead-frame over-molded with a high temperature plastic material prior to the assembly of an array as opposed to the prior art of encapsulating or over-molding an array package following the array assembly. An advantage of the current art is that it provides an improved method for a larger capacitor array size and therefore a larger bulk capacitance package size than that of prior art.

An embodiment of the invention maintains many of the benefits of prior art in that it allows the capacitors to be assembled on opposing sides of the carrier material. An embodiment also allows unsorted component sizes to be stacked and assembled to the carrier material and also the components can be in a vertical orientation. The current art can comprise components of different case sizes within the same module allowing more flexibility in module capacitance value. An embodiment can comprise other discreet electronic components can be combined such as capacitors, resistors, varistors, inductors, diodes, fuses, integrated circuits (IC), etc. into the package to create a custom electronic module. Prior art in the form of a smart capacitor incorporates an alumina substrate with printed thick film materials to form a fuse and resistor (U.S. Pat. Nos. 8,904,609, 8,264,816) rather than the use of discreet components or as an MLCC stack carrier. Other prior art has used a lead frame to provide a fuse with an MLCC (US 20140238732, US20140240941, US20140240081, US20140240942, US20140240885). Using discreet components allows increased flexibility in the assembly of the package without adding complexity to the module design. Discreet component values can be changed quickly, easily, and without a large cost impact to meet the requirements of a circuit design.

An embodiment allows for a method of assembly that utilizes current SMT and component through-hole process assembly technologies and common commercially available assembly equipment. This assembly method provides for a more reasonable investment cost and implementation timing.

A method of assembly could be easily implemented with the use of standard equipment and processes such as a lead frame carrier and/or pallet fixture for the part presentation and commercially available machines that are capable of applying interconnect materials, placing components, performing inspection, curing/reflowing/sintering interconnect materials, trimming/forming leads, and encapsulating the assembly.

A through-hole assembly stand-off feature, as utilized herein, provides a physical barrier to the insertion of a through hole beyond a certain depth.

Transient liquid phase sintering adhesives (TLPS) are conductive materials that are distinguished from solders. Solders are alloys which do not undergo a change in composition after the first reflow. TLPS materials are mixtures of two or more metals or metal alloys prior to exposure to elevated temperatures. The second distinguishing characteristic of TLPS materials is that the melting point of the material is dependent on the thermal history of the material. TLPS materials exhibit a low melting point prior to exposure to elevated temperatures, and a higher melting point following exposure to these temperatures. The initial melting point is the result of the low temperature metal or an alloy of two low temperature metals. The second melting temperature is that of the intermetallic formed when the low temperature metal or alloy, forms a new alloy with a high temperature melting point metal thereby creating an intermetallic having a higher melting point. TLPS materials form a metallurgical bond between the metal surfaces to be joined. Unlike tin/lead or lead (Pb) free solders, the TLPS conductive adhesives do not spread as they form the intermetallic joint. Rework of the TLPS system is very difficult due to the high secondary reflow temperatures.

Conductive adhesives comprise conductive metal, typically silver, filled polymers that cure or cross link within a specified temperature range, generally 150° C., to form a mechanical bond to the materials to be joined. Their conductivity is created by the metal particles which make intimate contact with one another, within the confines of the polymer matrix, to form an electrically conductive path from one particle to another. Because the binder is organic in nature, they have relatively low temperature capabilities, normally in the range of about 150° C. to about 300° C. Conductive epoxies, once cured, cannot be reworked. Conductive epoxies do not wet or flow as they cure as do solders when they melt.

Polymer solders may comprise conventional solder systems based on Pb/Sn alloy systems or lead free systems, such as Sn/Sb, which are combined with cross linking polymers which serve as cleaning agents. The cross-linked polymers also have the ability to form a cross-linked polymer bond, such as an epoxy bond, that forms during the melting phase of the metals thereby forming a solder alloy and a mechanical polymeric bond. An advantage of polymer solders is that the polymeric bond provides additional mechanical bond strength at temperatures above the melting point of the solder, thus giving the solder joint a higher operating temperature in the range of about 5 to 80° C. above the melting point of the solder. Polymer solders combine current solder alloys with a cross linking polymer within the same paste to provide both a metallurgical bond and a mechanical bond when cured, such as by heating, to provide additional solder joint strength at elevated temperatures. However, the upper temperature limits and joint strength has been increased, just by the physical properties of the materials. A practical limit of 300° C. remains whereas the transient liquid phase sintering conductive adhesives can achieve higher temperatures.

In use, conductive adhesives and conductive polymers can be coated onto one side being bonded. With reference to FIG. 2, for example, the conductive adhesive can be placed on either the carrier material or the longitudinal edge. The component and carrier material can be placed into position with the interconnect thereby between followed by heating to form the bond there between.

TLPS comprise high temperature materials selected from copper, silver, aluminum, gold, platinum, palladium, beryllium, rhodium, nickel, cobalt, iron and molybdenum or a mixture or any combination thereof are suitable for use in transient liquid phase sintering conductive adhesives. The lead (Pb) free transient liquid phase sintering adhesives preferably use either silver or copper as the high temperature component and a tin-bismuth alloy as the low temperature component.

TLPS further comprises low temperature materials selected from tin, antimony, bismuth, cadmium, zinc, gallium, indium, tellurium, mercury, thallium, selenium, or polonium, or a mixture or an alloy of any two or more of these. The transient liquid phase sintering conductive adhesives are compatible with surface finishes containing silver, tin, gold, copper, platinum, palladium, nickel, or combinations thereof, either as lead frame finishes, component connections or inner electrodes to form an electronically conductive metallurgical bond between two surfaces. Suitable external lead or lead frame materials include phosphor bronze, copper, alloys of copper such as but not limited to beryllium copper, Cu194 and Cu192, as well as lead frames consisting of ferrous alloys such as but not limited to Alloy 42 and Kovar.

A particular advantage of the TLPS is the flexibility provided in assembly. The high temperature component and low temperature component can be coated on one of the layers being bonded. With reference to FIG. 2, the elements of the TLPS can be coated on either the lead or the longitudinal edge and heated to form the bond after the component and lead are brought into relationship with the TLPS components there between. Alternatively, one component of the TLPS can be coated on the lead and the other coated on the longitudinal edge with heating after the component and lead are brought into relationship to form the bond. In a preferred embodiment, one component of the TLPS can be coated on one side being bonded, the lead for example, and the other component of the TLPS can be coated on the other side being bonded, an external termination for example. The components can be brought into contact followed by heating to form the TLPS bond.

The invention has been described with reference to the preferred embodiments without limit thereto. One of skill in the art would realize additional embodiments and improvements which are not specifically set forth herein but which are within the scope of the invention as more specifically set forth in the claims appended hereto.

The invention claimed is:

1. A module comprising:
   a carrier material comprising a first conductive portion and a second conductive portion;
   a multiplicity of electronic components wherein each electronic component of said electronic components comprises a first external termination with at least one first longitudinal edge and a second external termination with at least one second longitudinal edge;
   a first electronic component of said multiplicity of electronic components wherein said first longitudinal edge of said first electronic component is connected to said first conductive portion by a first interconnect;
   a second electronic component of said multiplicity of electronic components wherein said first longitudinal edge of said second electronic component is connected to said first conductive portion by said first interconnect;
   and
   said second longitudinal edge of said first electronic component is connected to said second conductive portion by a second interconnect wherein said first longitudinal edge is on a first side face of four side faces of said first electronic component.

2. The module of claim 1 wherein said carrier material is a substrate.

3. The module of claim 2 wherein said substrate comprises a material selected from the group consisting of FR4, ceramic and polyimide.

4. The module of claim 1 wherein said carrier material is selected from the group consisting of a pair of leads of ferrous or non-ferrous material wherein a first lead of said pair of leads is said first conductive portion and a second lead of said pair of leads is said second conductive portion.

5. The module of claim 4 wherein said first conductive portion is a conductive trace on said substrate.

6. The module of claim 5 wherein said conductive trace is linear.

7. The module of claim 5 wherein said conductive trace deviates from linearity.

8. The module of claim 7 comprising electronic components of different sizes connected to said conductive trace.

9. The module of claim 4 wherein said first lead comprises an offset.

10. The module of claim 9 wherein said offset is selected from laterally offset and horizontally offset.

11. The module of claim 4 wherein said first lead is selected from a round lead frame and a flat lead.

12. The module of claim 11 wherein said first lead comprises at least one flattened region.

13. The module of claim 4 wherein said first lead is selected from a through-hole lead, surface mount lead and a compliant pin lead.

14. The module of claim 13 further comprising a through-hole assembly stand-off feature.

15. The module of claim 4 wherein said first lead comprises a material selected from a ferrous material and a non-ferrous material.

16. The module of claim 1 wherein said first longitudinal edge of said second electronic component is connected to said first conductive portion by an additional interconnect.

17. The module of claim 1 wherein a second longitudinal edge of said second electronic component is connected to a first longitudinal edge of a third electronic component by an additional interconnect.

18. The module of claim 1 wherein said multiplicity of electronic components are arranged in rows and columns wherein adjacent electronic components in said columns have adjacent longitudinal edges connected by an additional interconnect.

19. The module of claim 1 wherein at least one of said first interconnect or said second interconnect is selected from the group consisting of a transient liquid phase sintering conductive interconnect material.

20. The module of claim 1 wherein each said electronic component is independently selected from the group consisting of a capacitor, a diode, a resistor, a varistor, an inductor, a fuse and an integrated circuit.

21. The module of claim 20 wherein at least one said electronic component is a capacitor.

22. The module of claim 21 wherein each said electronic component is a capacitor.

23. The module of claim 22 wherein each said capacitor is an MLCC.

24. The module of claim 1 wherein at least two said electronic components have a different size.

25. The module of claim 1 further comprising an encapsulation.

26. The module of claim 1 further comprising an overmolded lead frame or pre-molded housing.

27. The module of claim 1 comprising at least 2 electronic components to no more than 100 electronic components.

28. A module comprising:
a carrier material comprising a first conductive portion and a second conductive portion;
a multiplicity of electronic components wherein each electronic component of said electronic components comprises a first external termination with at least one first longitudinal edge and a second external termination with at least one second longitudinal edge;
a first electronic component of said multiplicity of electronic components wherein said first longitudinal edge of said first electronic component is connected to said first conductive portion by a first interconnect;
a second electronic component of said multiplicity of electronic components wherein said first longitudinal edge of said second electronic component is connected to said first conductive portion by said first interconnect;
and
said second longitudinal edge of said first electronic component is connected to said second conductive portion by a second interconnect;
wherein said carrier material is selected from the group consisting of a pair of leads of ferrous or non-ferrous material wherein a first lead of said pair of leads is said first conductive portion and a second lead of said pair of leads is said second conductive portion; and wherein said first lead is a flat plated lead with at least one said electronic component on each side of said flat plated lead.

29. A method for forming a module comprising:
providing a multiplicity of electronic components wherein each electronic component of said electronic components comprises a first external termination with at least one first longitudinal edge wherein said first longitudinal edge is on a side face of four side faces of each electronic component of said electronic components and a second external termination with at least one second longitudinal edge;
placing a first conductor into contact with each said first longitudinal edge with a first interconnect between said first conductor and said first longitudinal edge;
placing a second conductor into contact with said second longitudinal edge with a second interconnect between said second conductor and said second longitudinal edge; and
heating to form a bond of said first interconnect and said second interconnect.

30. The method for forming a module of claim 29 wherein said first conductor is selected from the group consisting of a first lead and a circuit trace on a substrate.

31. The method for forming a module of claim 30 wherein said first lead comprises an offset.

32. The method for forming a module of claim 31 wherein said offset is selected from laterally offset and horizontally offset.

33. The method for forming a module of claim 30 wherein said first lead is selected from a round lead frame and a flat lead.

34. The method for forming a module of claim 33 wherein said first lead comprises at least one flattened region.

35. The method for forming a module of claim 30 wherein said first lead is selected from a through-hole lead and a surface mount lead.

36. The method for forming a module of claim 35 further comprising a through-hole assembly stand-off feature.

37. The method for forming a module of claim 30 wherein said first lead comprises a material selected from a ferrous material and a non-ferrous material.

38. The method for forming a module of claim 29 comprising bonding said first conductor to each first longitudinal edge by said first interconnect.

39. The method for forming a module of claim 29 wherein at least one of said first interconnect or said second interconnect is a transient liquid phase sintering conductive interconnect material.

40. The method for forming a module of claim 29 wherein each said electronic component is independently selected from the group consisting of a capacitor, a diode, a resistor, a varistor, an inductor, a fuse and an integrated circuit.

41. The method for forming a module of claim 40 wherein at least one said electronic component is a capacitor.

42. The method for forming a module of claim 41 wherein each said electronic component is a capacitor.

43. The method for forming a module of claim 42 wherein each said capacitor is an MLCC.

44. The method for forming a module of claim 29 wherein at least two said electronic components have a different size.

45. The method for forming a module of claim 29 further comprising forming an encapsulation.

46. The method for forming a module of claim 29 comprising at least 2 electronic components to no more than 100 electronic components.

47. The method for forming a module of claim 29 further comprising placing at least one electronic component in a second row or a second column with an interconnect between adjacent longitudinal edges and forming a bond of said interconnect.

48. A method for forming a module comprising:
providing a multiplicity of electronic components wherein each electronic component of said electronic components comprises a first external termination with at least one first longitudinal edge and a second external termination with at least one second longitudinal edge;
placing a first conductor into contact with each said first longitudinal edge with a first interconnect between said first conductor and said first longitudinal edge;
placing a second conductor into contact with said second longitudinal edge with a second interconnect between said second conductor and said second longitudinal edge; and
heating to form a bond of said first interconnect and said second interconnect;
wherein said first conductor is selected from the group consisting of a first lead and a circuit trace on a substrate wherein said first lead is a flat plated lead with at least one said electronic component on each side of said flat plated lead.

49. A module comprising:
a carrier material comprising a first conductive portion and a second conductive portion;
a multiplicity of electronic components wherein each electronic component of said electronic components comprises a first external termination with at least one first longitudinal edge and a second external termination with at least one second longitudinal edge wherein said first longitudinal edge is on a first side face of four side faces of said first electronic component; and
a row comprising at least two electronic components of said multiplicity of electronic components wherein each said first longitudinal edge of said at least two electronic components is in contact with said first interconnect.

50. The module of claim 49 wherein said carrier material is a substrate.

51. The module of claim 50 wherein said substrate comprises a material selected from the group consisting of FR4, ceramic and polyimide.

52. The module of claim 49 wherein said carrier material is selected from the group consisting of a pair of leads of ferrous or non-ferrous material wherein a first lead of said pair of leads is said first conductive portion and a second lead of said pair of leads is said second conductive portion.

53. The module of claim 52 wherein said first conductive portion is a conductive trace on said substrate.

54. The module of claim 53 wherein said conductive trace is linear.

55. The module of claim 53 wherein said conductive trace deviates from linearity.

* * * * *